United States Patent
Kim et al.

(10) Patent No.: US 12,119,066 B2
(45) Date of Patent: Oct. 15, 2024

(54) FLASH MEMORY DEVICE HAVING MULTI-STACK STRUCTURE AND CHANNEL SEPARATION METHOD THEREOF

(71) Applicant: SAMSUNG ELECTRONICS CO., LTD., Suwon-si (KR)

(72) Inventors: Hyebin Kim, Suwon-si (KR); Yohan Lee, Suwon-si (KR); Ho-Jun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 166 days.

(21) Appl. No.: 17/982,081

(22) Filed: Nov. 7, 2022

(65) Prior Publication Data

US 2023/0145117 A1   May 11, 2023

(30) Foreign Application Priority Data

Nov. 10, 2021   (KR) .................. 10-2021-0154258
May 26, 2022   (KR) .................. 10-2022-0064448

(51) Int. Cl.
*G11C 16/10* (2006.01)
*G11C 16/08* (2006.01)
*G11C 16/12* (2006.01)

(52) U.S. Cl.
CPC ............ *G11C 16/102* (2013.01); *G11C 16/08* (2013.01); *G11C 16/12* (2013.01)

(58) Field of Classification Search
CPC ....... G11C 16/102; G11C 16/08; G11C 16/12; G11C 16/3427; G11C 16/0483; G11C 16/34; H10B 43/27

USPC ...................... 365/189.011, 185.24
See application file for complete search history.

(56) References Cited

U.S. PATENT DOCUMENTS

| 4,691,301 A | * | 9/1987 | Anderson | ............ G11C 7/1006 365/225.7 |
| 5,694,356 A | * | 12/1997 | Wong | ............ G11C 27/005 365/185.21 |
| 6,069,835 A | * | 5/2000 | Matoba | ............ G11C 8/12 365/230.01 |

(Continued)

FOREIGN PATENT DOCUMENTS

| KR | 10-2020-0052664 A | 5/2020 |
| KR | 10-2136293 B1 | 7/2020 |

OTHER PUBLICATIONS

Communication issued Mar. 28, 2023 by the European Patent Office in counterpart European Patent Application No. 22205991.7.

*Primary Examiner* — Michael T Tran
(74) *Attorney, Agent, or Firm* — Sughrue Mion, PLLC

(57) ABSTRACT

A flash memory device is provided. The flash memory device includes: a first memory cell; a second memory cell on the first memory cell; and a third memory cell between the first memory cell and the second memory cell. The first memory cell, the second memory cell and the third memory cell share a channel. The third memory cell is configured to block channel sharing between the first memory cell and the second memory cell based on a channel separation voltage provided in first to k-th program loops. The third memory cell is configured to connect the channel sharing between the first memory cell and the second memory cell based on a channel connection voltage provided to the third memory cell in a (k+1)-th program loop.

20 Claims, 14 Drawing Sheets

(56) References Cited

U.S. PATENT DOCUMENTS

| | | | |
|---|---|---|---|
| 9,286,994 B1 * | 3/2016 | Chen | G11C 16/3427 |
| 9,514,827 B1 | 12/2016 | Nam et al. | |
| 9,589,647 B1 | 3/2017 | Ahn et al. | |
| 9,779,819 B1 * | 10/2017 | Tang | G11C 16/3459 |
| 10,438,671 B1 | 10/2019 | Chen et al. | |
| 10,541,033 B2 | 1/2020 | Jung et al. | |
| 10,847,228 B2 | 11/2020 | Lee | |
| 10,868,031 B2 | 12/2020 | Liu et al. | |
| 11,062,782 B2 | 7/2021 | Wang et al. | |
| 11,087,849 B2 | 8/2021 | Chin et al. | |
| 11,282,575 B2 | 3/2022 | Lee | |
| 2009/0180317 A1 | 7/2009 | Kang et al. | |
| 2011/0026329 A1 * | 2/2011 | Wada | G11C 16/10 |
| | | | 327/536 |
| 2012/0213006 A1 * | 8/2012 | Isomura | H10B 41/35 |
| | | | 257/E21.573 |
| 2016/0064044 A1 * | 3/2016 | Stansfield | G11C 7/18 |
| | | | 365/189.15 |
| 2019/0371406 A1 * | 12/2019 | Yang | G11C 16/10 |
| 2020/0075105 A1 * | 3/2020 | Yoshida | G11C 16/0433 |
| 2020/0143890 A1 | 5/2020 | Lee | |
| 2020/0168279 A1 * | 5/2020 | Lee | G11C 16/3459 |
| 2020/0211670 A1 * | 7/2020 | Chen | G11C 16/10 |
| 2020/0356848 A1 * | 11/2020 | Lesso | G11C 13/004 |
| 2021/0304822 A1 * | 9/2021 | Lien | G11C 16/26 |

* cited by examiner

FIG.8

| PGM Loop | 1 | 2 | 3 | ••• | k-1 | k | k+1 | 18 | 19 | 20 |
|---|---|---|---|---|---|---|---|---|---|---|
| Scheme 1 | VMOFF (channel separation) | | | | | | | | | |
| Scheme 2 | VMOFF (channel separation) | | | | | | VMON (channel connection) | | | |

FLASH MEMORY DEVICE HAVING MULTI-STACK STRUCTURE AND CHANNEL SEPARATION METHOD THEREOF

CROSS-REFERENCE TO RELATED APPLICATIONS

This application claims priority to Korean Patent Application 10-2022-0064448, filed on May 26, 2022, in the Korean Intellectual Property Office, and to Korean Patent Application No. 10-2021-0154258 filed on Nov. 10, 2021, in the Korean Intellectual Property Office, the disclosures of which are incorporated by reference herein in their entireties.

BACKGROUND

Embodiments described herein relate to a semiconductor memory device, and more particularly, to a flash memory device with a multi-stack structure and a channel separation method thereof.

A semiconductor memory device may be classified as a volatile memory device or a non-volatile memory device. The volatile memory device is fast in read and write speeds, but loses data stored therein when power is turned off. In contrast, the non-volatile memory device retains data stored therein even when power is turned off. The non-volatile memory device may be used in the case where data should be retained regardless of the power.

A flash memory device may be a representative example of the non-volatile memory device. Nowadays, like a vertical NAND flash memory device (VNAND), a technology for stacking memory cells in a three-dimensional structure is being actively developed to improve the degree of integration. In a vertical flash memory device, the number of word line layers stacked in a vertical direction is increasing with each generation. The number of string selection lines formed in the uppermost gate layer is also increasing.

As the number of word lines increases, pass voltage disturbance that memory cells connected with an unselected word line experience during programming increases. Also, as the number of string selection lines increases, program voltage disturbance that memory cells connected with a selected word line but belonging to an unselected cell string experience during programming increases.

SUMMARY

One or more embodiments provide a channel separation method of a flash memory device capable of reducing disturbance that memory cells suffer during a program operation.

According to an embodiment, a flash memory device includes: a first memory cell; a second memory cell on the first memory cell; and a third memory cell between the first memory cell and the second memory cell. The first memory cell, the second memory cell and the third memory cell share a channel. The third memory cell is configured to block channel sharing between the first memory cell and the second memory cell based on a channel separation voltage provided in first to k-th program loops. The third memory cell is configured to connect the channel sharing between the first memory cell and the second memory cell based on a channel connection voltage provided to the third memory cell in a (k+1)-th program loop.

According to an embodiment, a flash memory device includes: a first word line connected with a first memory cell; a second word line connected with a second memory cell on the first memory cell; and a third word line connected with a third memory cell between the first memory cell and the second memory cell. The first memory cell, the second memory cell and the third memory cell share a channel. Regions of the channel are classified depending on a location of the second word line, and a channel separation voltage or a channel connection voltage is provided to the third word line depending on a number of program loops, which is differently determined depending on the regions.

According to an embodiment, a channel separation method of a flash memory device which includes a first stack including first memory cells, and a second stack including second memory cells provided on the first stack, is provided. The channel separation method includes: defining a plurality of regions depending on channel diameters of the second memory cells; determining whether a program loop associated with a memory cell selected from the second memory cells reaches a specific program loop; and controlling channel connection or channel separation between the first stack and the second stack depending on a number of program loops. The controlling the channel connection or the channel separation is differently determined for each of the plurality of regions.

BRIEF DESCRIPTION OF THE FIGURES

The above and other objects and features will be more clearly understood from the following description, taking in conjunction with reference to the accompanying drawings, in which:

FIG. 8 illustrates a table for describing a channel separation operation or a channel connection operation of a flash memory device according to an embodiment;

DETAILED DESCRIPTION

Hereinafter, embodiments are described in conjunction with the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation.

Figure 1:
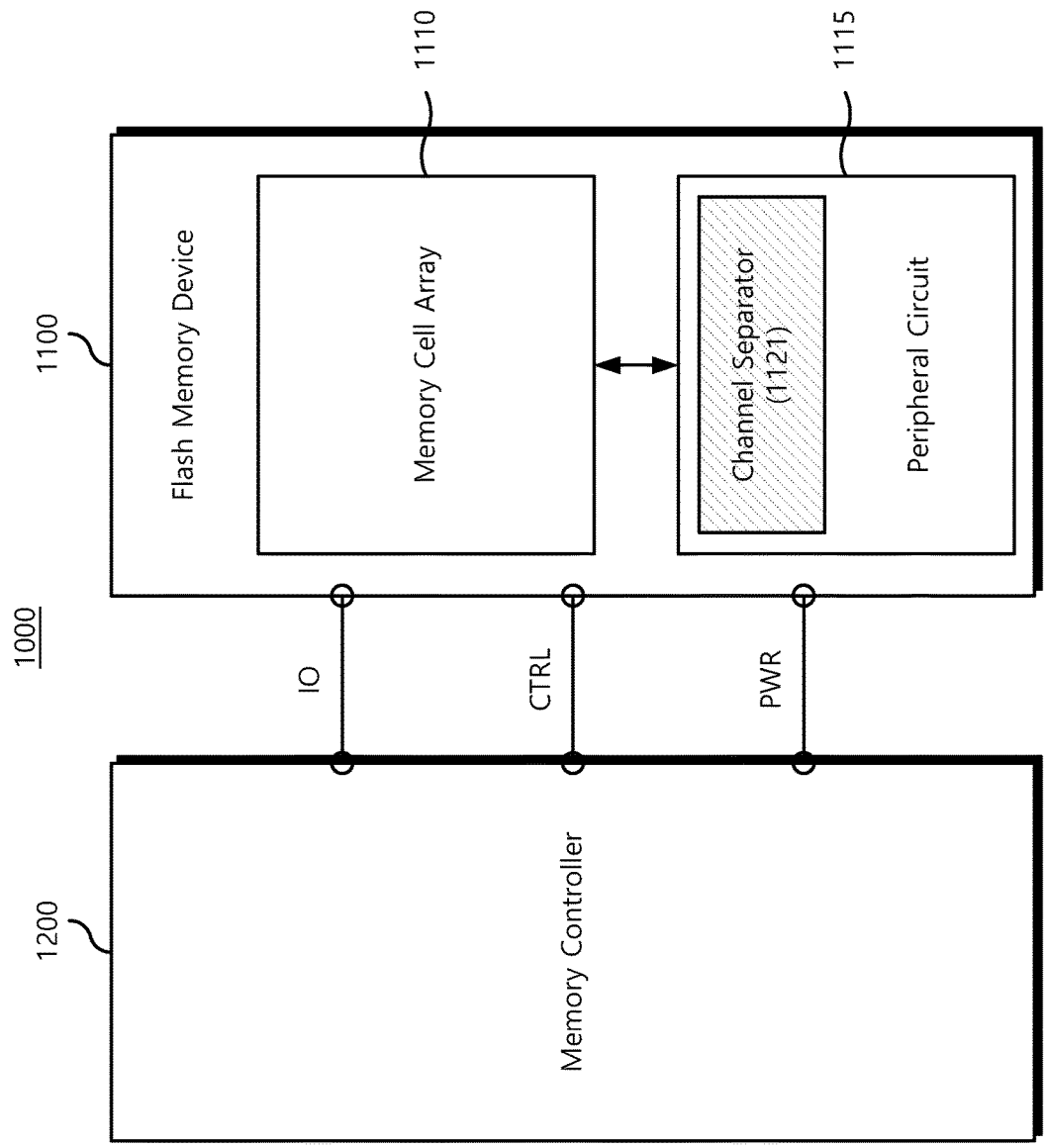
FIG. 1 is a block diagram illustrating a data storage device according to an embodiment.

FIG. 1 is a block diagram illustrating a data storage device according to an embodiment. Referring to FIG. 1, a data storage device 1000 may include a flash memory device 1100 and a memory controller 1200. The flash memory device 1100 and the memory controller 1200 may be connected through a data input/output line IO, a control line CTRL, and a power line PWR.

Under control of the memory controller 1200, the data storage device 1000 may store data in the flash memory device 1100. The flash memory device 1100 includes a memory cell array 1110 and a peripheral circuit 1115. The peripheral circuit 1115 may include an analog circuit, digital circuits, or a combination of analog and digital circuits, which are used to store data in the memory cell array 1110 or to read data from the memory cell array 1110.

The memory cell array 1110 may include a plurality of memory blocks. Each of the memory blocks may have a vertical three-dimensional structure. Each of the memory blocks may include a plurality of memory cells. Multi-bit data may be stored in each of the memory cells. The memory cell array 1110 may be provided next to the peripheral circuit 1115 or on the peripheral circuit 1115 on a design/layout structure. A structure where the memory cell array 1110 is provided on the peripheral circuit 1115 is referred to as a cell on peripheral (COP) structure.

In the COP structure, the memory cell array 1110 may have a pillar structure where a channel diameter CD decreases as it goes toward a substrate. Due to a characteristic of the pillar structure of the memory cell array 1110, there is a limitation on stacking memory cells with one stack. For this reason, the flash memory device 1100 may have a multi-stack structure where two or more stacks are piled.

The peripheral circuit 1115 may be supplied with an external power PWR from the memory controller 1200 and may internally generate powers of various levels. The peripheral circuit 1115 may receive a command, an address, and data from the memory controller 1200 through the data input/output line IO. The peripheral circuit 1115 may store data in the memory cell array 1110 in response to a control signal CTRL. Also, the peripheral circuit 1115 may read data stored in the memory cell array 1110 and may provide the read data to the memory controller 1200.

The peripheral circuit 1115 may include a channel separator 1121. The channel separator 1121 may perform a channel separation operation or a channel connection operation. Herein, the channel separation operation may refer to an operation of blocking a flow of a channel current flowing in a cell string of a pillar structure. Alternatively, the channel separation operation may refer to an operation of separating a channel current path of the cell string.

In the flash memory device 1100, the number of word line layers may be increased by connecting (or joining) two or more stacks. However, the increase in the number of word line layers may cause pass voltage disturbance and program voltage disturbance during the program operation of the flash memory device 1100. The pass voltage disturbance occurs due to the stress that memory cells connected with an unselected word line suffer. The program voltage disturbance occurs due to the stress on memory cells connected with a selected word line that belong to an unselected cell string.

The flash memory device 1100 according to an embodiment may reduce the program voltage disturbance or the pass voltage disturbance through the channel separation operation. In particular, the flash memory device 1100 may perform the channel connection operation or the channel separation operation based on a program loop or a channel diameter, thus reducing a leakage current between separated channels and also effectively reducing the disturbance during the program operation. Below, the channel separation operation of the flash memory device 1100 will be described mainly with reference to a 2-stack structure but may also be applied to a single stack structure or a multi-stack structure including two or more stacks.

Figure 2:
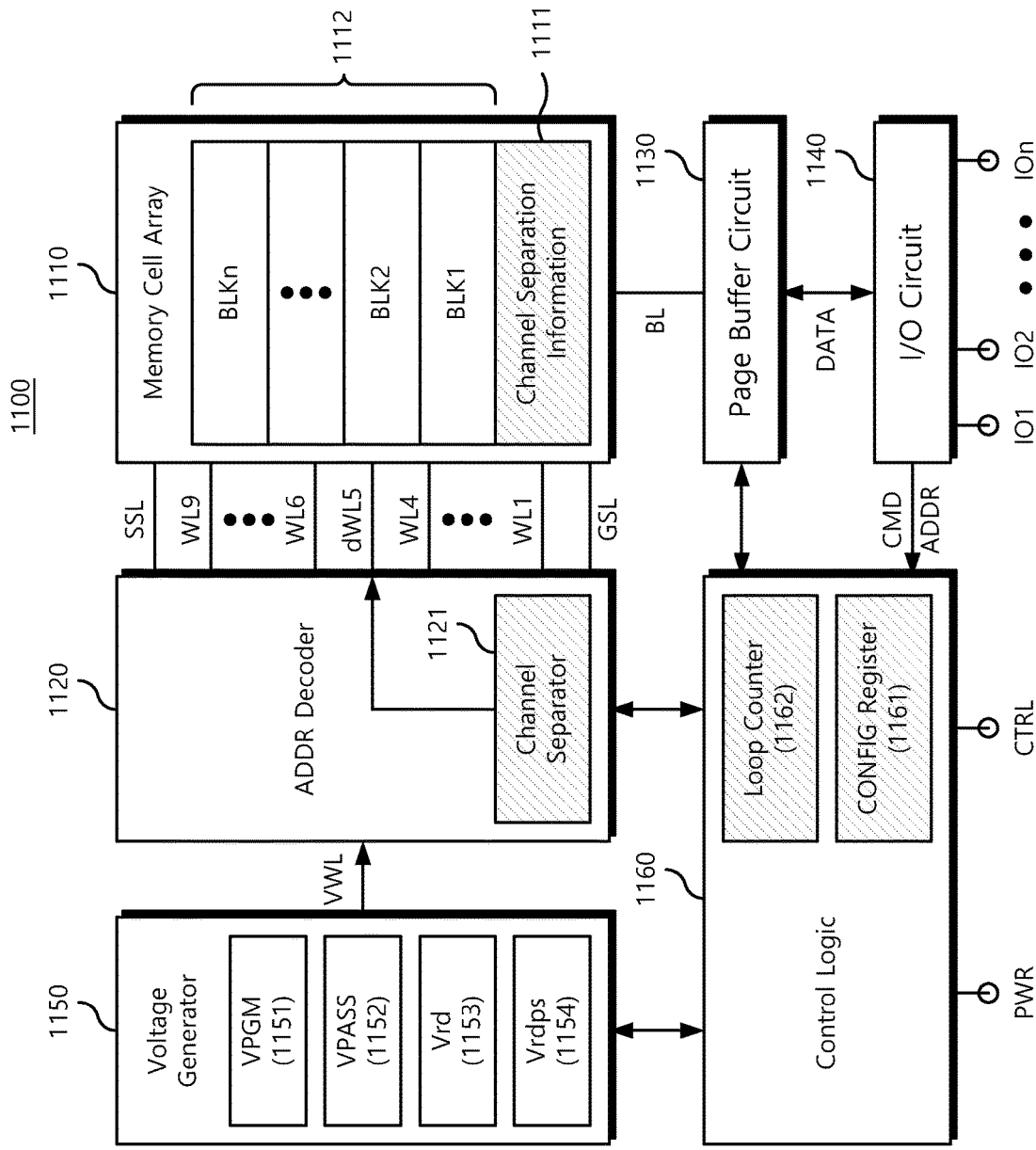
FIG. 2 is a block diagram illustrating a flash memory device according to an embodiment.

FIG. 2 is a block diagram illustrating a flash memory device illustrated in FIG. 1. Referring to FIG. 2, the flash memory device 1100 may include the memory cell array 1110, an address decoder 1120, a page buffer circuit 1130, a data input/output circuit 1140, a voltage generator 1150, and control logic 1160.

The memory cell array 1110 may include a memory block 1111 configured to store channel separation information and memory block 1112 configured to store normal data. When the flash memory device 1100 is booted up, the channel separation information may be loaded onto the control logic 1160. The channel separation information may be used as a parameter for setting various operations of the flash memory device 1100. For example, the channel separation information may be used to set the following for channel separation or channel connection: an operating voltage, an operating condition, and an operating timing.

The memory block 1112 may be formed in a direction perpendicular to a substrate. A gate electrode layer and an insulation layer may be alternately and repeatedly deposited on the substrate. The gate electrode layers of the memory block (e.g., BLK1) may be connected with a string selection line SSL, a plurality of word lines WL1 to WL9, and a ground selection line GSL. In FIG. 2, dWL5 may be a dummy word line. The dummy word line dWL5 may be used to form or block a current path of a channel associated with the first to ninth word lines WL1 to WL9.

The address decoder 1120 may be connected with the memory cell array 1110 through the selection lines SSL and GSL, the word lines WL1 to WL4 and WL6 to WL9, and the dummy word line dWL5. The address decoder 1120 may select a word line in the program or read operation. The address decoder 1120 may receive a word line voltage VWL from the voltage generator 1150 and may provide the selected word line with the program voltage or the read voltage.

The address decoder 1120 may include the channel separator 1121. The channel separator 1121 may separate a channel of a memory block (e.g., BLK1) with a vertical three-dimensional structure. For example, the channel separator 1121 may provide a separation voltage VMOFF to the dummy word line dWL5 such that the current path of the channel is blocked and may provide a connection voltage VMON to the dummy word line dWL5 such that the current path of the channel is formed.

The channel separation operation of the channel separator 1121 may be performed to reduce the program disturbance. The program disturbance may occur at a program inhibit cell connected with the same word line when the program voltage VPGM being a high voltage is applied to the selected word line WLs during the program operation. Also, the program disturbance may occur at a memory cell connected with an unselected word line WLu when the pass voltage VPASS is applied to the unselected word line WLu. The flash memory device 1100 according to an embodiment may reduce the program disturbance by performing the channel separation operation.

The channel separation operation of the channel separator 1121 may be performed in various schemes. For example, the channel separator 1121 may perform the channel separation operation or the channel connection operation depending on a program loop, during the program operation. For example, the channel may be in a separation state initially. When a program loop count value is greater than a reference loop value in the program operation, the channel may switch from the separation state to a connection state. The channel separator 1121 may connect channels by providing the connection voltage VMON to the dummy word line dWL5.

The page buffer circuit 1130 may be connected with the memory cell array 1110 through bit lines BL. The page buffer circuit 1130 may temporarily store data to be programmed in the memory cell array 1110 or data read from the memory cell array 1110. The page buffer circuit 1130 may include a page buffer that is connected with each bit line BL. Each page buffer may include a plurality of latches for the purpose of storing or reading multi-bit data.

The data input/output circuit 1140 may be internally connected with the page buffer circuit 1130 through data lines and may be externally connected with the memory controller 1200 (refer to FIG. 1) through input/output lines IO1 to IOn. During the program operation, the data input/output circuit 1140 may receive program data from the memory controller 1200. During the read operation, the data input/output circuit 1140 may provide the memory controller 1200 with data read from the memory cell array 1110.

The voltage generator 1150 may be supplied with an internal power from the control logic 1160 and may generate the word line voltage VWL used to read or write data. The word line voltage VWL may be provided to a selected word line WLs or an unselected word line WLu through the address decoder 1120.

The voltage generator 1150 may include a program voltage (VPGM) generator 1151 and a pass voltage (VPASS) generator 1152. The program voltage generator 1151 may generate the program voltage VPGM that is provided to the selected word line WLs during the program operation. The pass voltage generator 1152 may generate the pass voltage VPASS that is provided to the selected word line WLs and the unselected word line WLu.

The voltage generator 1150 may further include a read voltage (Vrd) generator 1153 and a read pass voltage (Vrdps) generator 1154. The read voltage generator 1153 may generate a selection read voltage Vrd that is provided to the selected word line WLs during the read operation. The read pass voltage generator 1154 may generate a read pass voltage Vrdps that is provided to the unselected word line WLu. The read pass voltage Vrdps may be a voltage sufficient to turn on memory cells connected with the unselected word line WLu during the read operation.

The control logic 1160 may control the program, read, and erase operations of the flash memory device 1100 by using a command CMD, an address ADDR, and the control signal CTRL provided from the memory controller 1200. The address ADDR may include a block address (or block selection address) that indicates, and may be used for selecting, one memory block, and a row address and a column address that indicate, and may be used for selecting, one memory cell of the selected memory block.

The control logic 1160 may include a configuration register 1161 and a loop counter 1162. A loop, for example, may include a program operation and a program verification operation. The configuration register 1161 may receive the channel separation information from the memory cell array 1110 and may generate a configuration parameter. The configuration register 1161 may control the channel separation operation or the channel connection operation of the channel separator 1121 by using the configuration parameter.

During the program operation, the loop counter 1162 may count the number of program loops and may generate a loop count signal. The loop counter 1162 may receive a pass or fail signal according to a program verify operation and an incremental pulse step programming (ISPP) operation and may generate the loop count signal. The loop counter 1162 may provide the loop count signal to the channel separator 1121. The loop counter 1162 may provide the loop count signal such that the current path of the channel is formed (or connected) or blocked.

Figure 3:
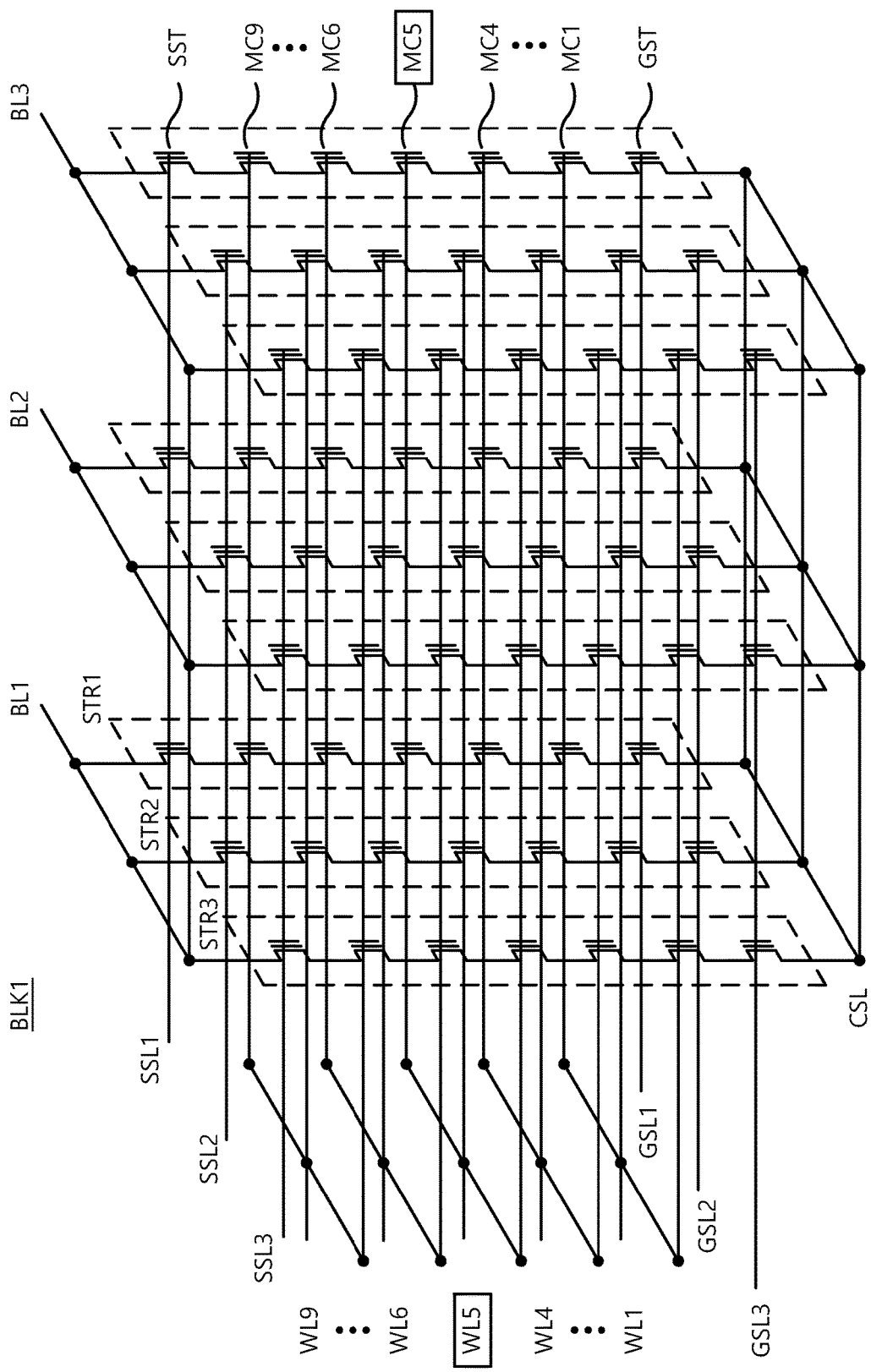
FIG. 3 is a circuit diagram illustrating a memory block of a memory cell array according to an embodiment.

FIG. 3 is a circuit diagram illustrating the memory block BLK1 of a memory cell array of FIG. 2. Referring to FIG. 3, in the memory block BLK1, a plurality of cell strings STR1 to STR3 may be formed between bit lines BL1 to BL3 and a common source line CSL. Each cell string includes a string selection transistor SST, a plurality of memory cells MC1 to MC4 and MC6 to MC9, a dummy memory cell dMC5, and a ground selection transistor GST.

The string selection transistors SST may be connected with string selection lines SSL1 to SSL3. The ground selection transistors GST may be connected with ground selection lines GSL1 to GSL3. The string selection transistors SST may be connected with the bit lines BL1 to BL3, and the ground selection transistors GST may be connected with the common source line CSL.

The plurality of memory cells MC1 to MC4 and MC6 to MC9 may be connected with the plurality of word lines WL1 to WL4 and WL6 to WL9. The first word line WL1 may be provided above the ground selection lines GSL1 to GSL3. The first memory cells MC1 that are provided at the same height from the substrate may be connected with the first word line WL1. The fourth memory cells MC4 that are provided at the same height from the substrate may be connected with the fourth word line WL4.

Likewise, the sixth memory cells MC6 may be connected with the sixth word line MC6, and the ninth memory cells MC9 may be connected with the ninth word line WL9. The dummy word line dWL5 may be interposed between the fourth word line WL4 and the sixth word line WL6. The dummy memory cells dMC5 that are provided at dummy word height from the substrate may be connected with the dummy word line dWL5.

Figure 4:
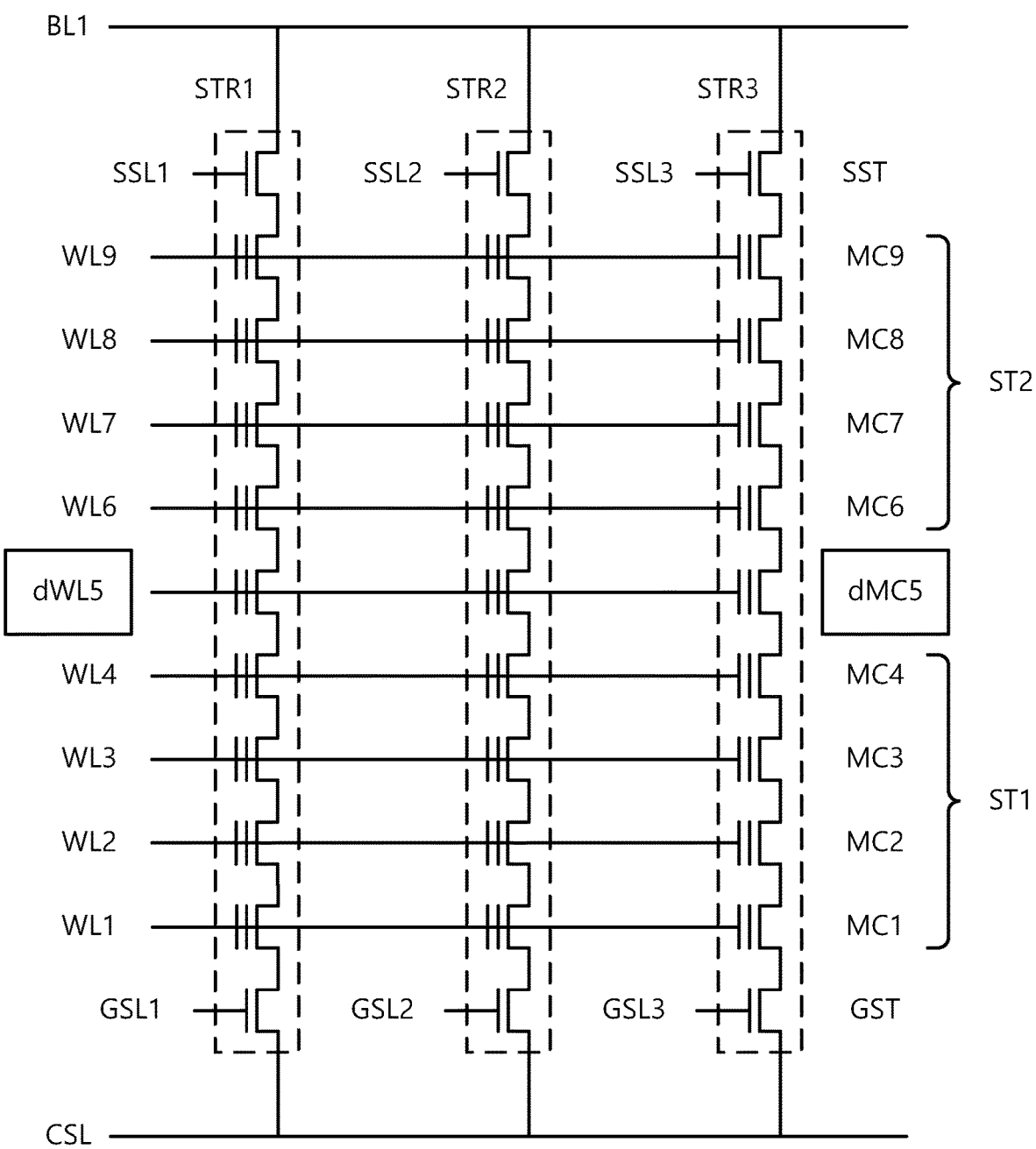
FIG. 4 is a circuit diagram illustrating cell strings connected with a bit line and a common source line from among cell strings of a memory block according to an embodiment.

FIG. 4 is a circuit diagram illustrating the cell strings STR1 to STR3 connected with the bit line BL1 and the common source line CSL from among cell strings of the memory block BLK1 illustrated in FIG. 3. Each of the cell strings STR1 to STR3 includes the string selection transistor SST that is selected by string selection line SSL1, SSL2, or SSL3, the plurality of memory cells MC1 to MC4 and MC6 to MC9 that are controlled by the plurality of word lines WL1 to WL4 and WL6 to WL9, the dummy memory cell dMC5 that is controlled by the dummy word line dWL5, and the ground selection transistor GST that is selected by the ground selection line GSL1, GSL2, or GSL3.

Each of the cell strings STR1 to STR3 may include a first stack ST1 and a second stack ST2 separated from each other by (or based on) the dummy word line dWL5. The first stack ST1 may include the memory cells MC1 to MC4 connected with the first to fourth word lines WL1 to WL4. The second stack ST2 may include the memory cells MC6 to MC9 connected with the sixth to ninth word lines WL6 to WL9.

An example where the memory block BLK1 includes only one dummy word line dWL5 is illustrated in FIGS. 3 and 4, but the present disclosure is not limited thereto. For example, the memory block BLK1 may include two or more dummy word lines. Also, the dummy word line dWL5 may be included in the first stack ST1 or the second stack ST2 or may be included in both the first stack ST1 and the second stack ST2. For example, two dummy word lines dWL5 may be present in the first stack ST1, and two dummy word line dWL5 may be present in the second stack ST2.

Figure 5:
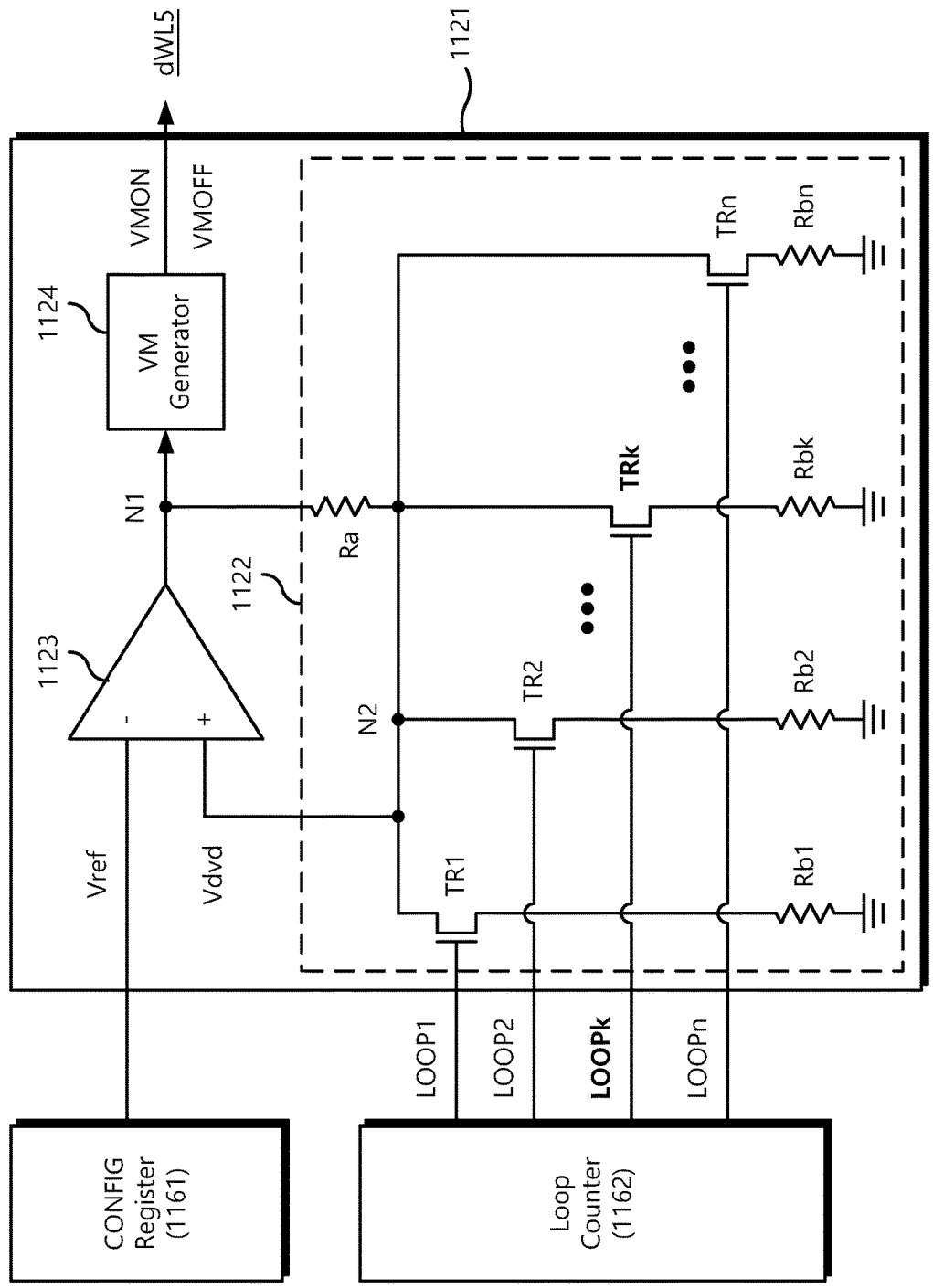
FIG. 5 is a block circuit diagram for describing a channel separator according to an embodiment.

FIG. 5 is a block circuit diagram for describing a channel separator. The channel separator 1121 may receive a reference voltage Vref from the configuration register 1161 and may receive loop count signals LOOP1 to LOOPn from the loop counter 1162. The channel separator 1121 may provide the dummy word line dWL5 with the channel separation voltage VMOFF or the channel connection voltage VMON in response to the reference voltage Vref and the loop count signals LOOP1 to LOOPn.

Referring to FIG. 5, the channel separator 1121 may include a voltage divider 1122, a comparator 1123, and a separation voltage generator 1124. The voltage divider 1122 may include a top resistor Ra, a plurality of transistors TR1 to TRn, and a plurality of bottom resistors Rb1 to Rbn. The top resistor Ra may be connected between a first node N1 and a second node N2. The plurality of transistors TR1 to TRn and the plurality of bottom resistors Rb1 to Rbn may be connected between the second node N2 and a ground terminal.

The first transistor TR1 may be connected between the second node N2 and the first bottom resistor Rb1 and may be turned on or turned off by the first loop count signal LOOP1. The second transistor TR2 may be connected between the second node N2 and the second bottom resistor Rb2 and may be turned on or turned off by the second loop count signal LOOP2. Likewise, the n-th transistor TRn may be connected between the second node N2 and the n-th bottom resistor Rbn and may be turned on or turned off by the n-th loop count signal LOOPn.

For example, when the loop counter 1162 provides the k-th loop count signal LOOPk, the k-th transistor TRk may be turned on. When the k-th transistor TRk is turned on, a voltage of the first node N1 may be divided by the top resistor Ra and the k-th bottom resistor Rbk, and a division voltage Vdvd may be formed at the second node N2. The voltage divider 1122 may provide the division voltage Vdvd of the second node N2 to the comparator 1123.

The comparator 1123 may receive the reference voltage Vref from the configuration register 1161 and may receive the division voltage Vdvd from the voltage divider 1122. The reference voltage Vref may be input to an inverting terminal (−) of the comparator 1123, and the division voltage Vdvd may be provided to a non-inverting terminal (+) of the comparator 1123. When the division voltage Vdvd is greater than the reference voltage Vref, the comparator 1123 may provide the first node N1 with an output voltage for operating the separation voltage generator 1124.

The separation voltage generator 1124 may be connected between the first node N1 and the dummy word line dWL5. The separation voltage generator 1124 may provide the dummy word line dWL5 with the separation voltage VMOFF or the connection voltage VMON in response to the output voltage of the comparator 1123. Herein, the connection voltage VMON may refer to a voltage for turning on the dummy memory cells dMC5 connected with the dummy word line dWL5, and the separation voltage VMOFF may refer to a voltage for turning off the dummy memory cells dMC5.

Figure 6:
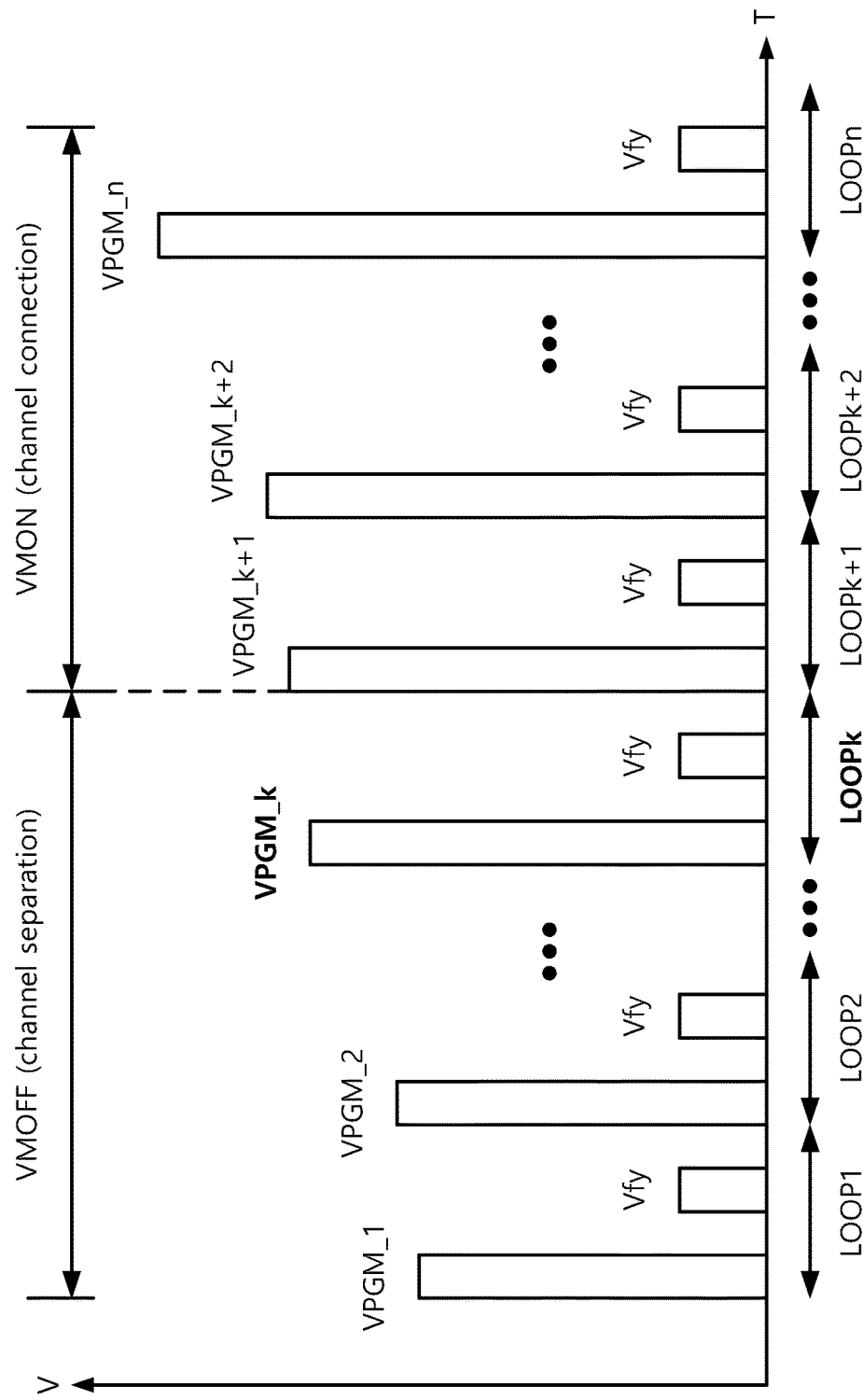
FIG. 6 is a timing diagram for describing an operation of a channel separator according to an embodiment.

FIG. 6 is a timing diagram for describing an operation of a channel separator illustrated in FIG. 5. In FIG. 6, a horizontal axis represents a time during which a program loop is performed, and a vertical axis represents a voltage level of the program voltage VPGM and the program verify voltage Vfy.

The flash memory device 1100 repeats the program loop depending on the ISPP scheme during the program operation. In each program loop, the program voltage VPGM and the program verify voltage Vfy are applied to a selected word line. As the program loop progresses, the program voltage VPGM may increase by a given level (or increment). The flash memory device 1100 may be in a channel separation state by default in early program loops and may change from the channel separation state to a channel connection state after the early program loops.

Referring to FIG. 6, in the first program loop, the program operation may be performed by using the first program voltage VPGM_1 and the program verify voltage Vfy. After the first program loop is performed, the loop counter 1162 (refer to FIG. 5) may generate the first loop count signal LOOP1.

In the second program loop, the program operation may be performed by using the second program voltage VPGM_2 and the program verify voltage Vfy. After the second program loop is performed, the loop counter 1162 may generate the second loop count signal LOOP2. Herein, the second program voltage VPGM_2 may be higher than the first program voltage VPGM_1 by the given level.

Likewise, in the n-th program loop, the program operation may be performed by using the n-th program voltage VPGM_n and the program verify voltage Vfy. After the n-th program loop is performed, the loop counter 1162 may generate the n-th loop count signal LOOPn.

The separation voltage generator 1124 may generate the separation voltage VMOFF during the first to k-th program loops. When the separation voltage VMOFF is applied to the dummy word line dWL5, channels of the first stack ST1 and the second stack ST2 may be in the separation state. This is referred to as a "channel OFF state" or "channel separation state".

As the k-th program loop is performed, the k-th loop count signal LOOPk may be generated, and thus, the separation voltage generator 1124 may generate the connection voltage VMON. The connection voltage VMON may be applied to the dummy word line dWL5. In this case, the flash memory device 1100 may perform the channel connection operation. That is, a channel between first and second stacks (refer to FIG. 4) is in the connection state. This is referred to as a "channel ON state" or "channel connection state".

The flash memory device 1100 may maintain the channel separation state in the first to k-th program loops and may change from the channel separation state to the channel connection state from the (k+1)-th program loop. That is, the flash memory device 1100 may separate channels of stacks in early program loops and may connect the channels of the stacks from a specific program loop.

Figure 7:
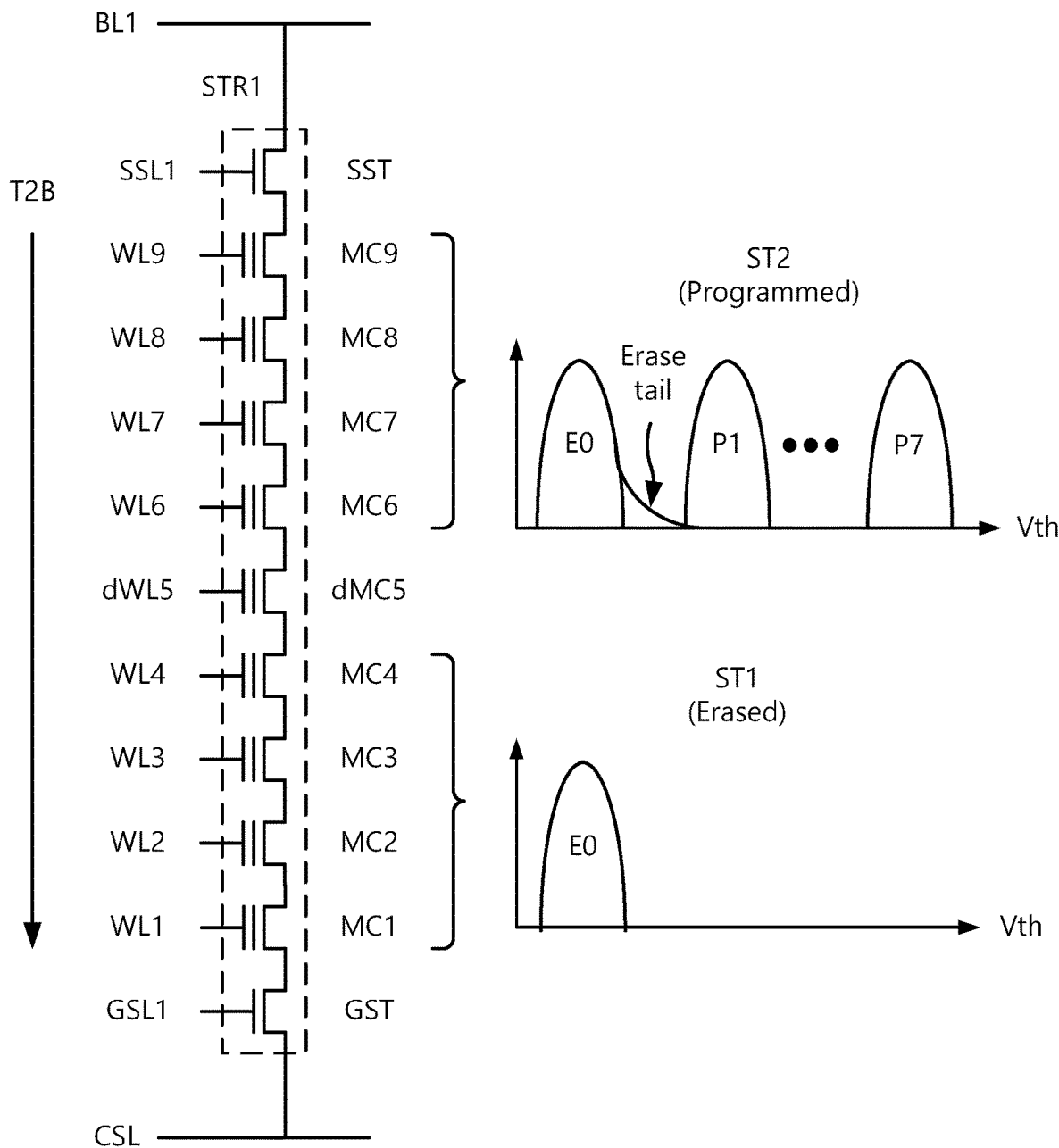
FIG. 7 is a diagram for describing a program operation of a flash memory device according to an embodiment.

FIG. 7 is a diagram for describing a channel separation operation or a channel connection operation of a flash memory device illustrated in FIG. 2. Referring to FIG. 7, the ground selection transistor GST, the first to ninth memory cells MC1 to MC9, and the string selection transistor SST are connected between the bit line BL1 and the common source line CSL. The ground selection transistor GST is connected with the ground selection line GSL1. The first to ninth word lines WL1 to WL9 are connected with the first to ninth memory cells MC1 to MC9. The string selection line SSL1 is connected with the string selection transistor SST.

FIG. 7 is a diagram for describing a program operation of a flash memory device illustrated in FIG. 2. Referring to FIG. 7, the ground selection transistor GST, the first to ninth memory cells MC1 to MC9, and the string selection transistor SST are connected between the bit line BL and the common source line CSL. The ground selection transistor GST is connected with the ground selection line GSL1. The first to ninth word lines WL1 to WL9 are connected with the first to ninth memory cells MC1 to MC9. The string selection line SSL1 is connected with the string selection transistor SST.

Threshold voltage (Vth) states of multi-level cells configured to store 3-bit data are illustrated in FIG. 7 as an example. According to the operation scenario of the flash memory device 1100, a top to bottom (T2B) program operation, in which programming is sequentially performed from the uppermost word line toward the bottom, may be performed. The T2B program operation has a program order where data are filled from top to bottom as the amount of data stored in a memory block increases.

All the memory cells MC1 to MC4 connected with the first to fourth word lines WL1 to WL4 are in the erase state E0. The memory cells MC6 to MC9 connected with the sixth to ninth word lines WL6 to WL9 may have the erase state E0 or one or program states P1 to P7 depending on data stored therein.

Below, the program operation having the T2B program order will be described as an example. However, the flash memory device 1100 according to an embodiment may also be applied to a bottom to top (B2T) program order where programming is sequentially performed from the lowermost word line toward the top. Also, the channel separation or connection operation may be identically applied to a program scheme where programming is performed from a central word line toward the top or toward the bottom.

Referring to FIG. 7, in the flash memory device 1100, a leakage current may occur when the channel separation is not properly made at the dummy memory cell dMC5 connected with the dummy word line dWL5. Charges in the channel of the second stack ST2 may be leaked out to the channel of the first stack ST1. In this case, a threshold voltage distribution of memory cells of the second stack ST2, which are in the erase state, may be disturbed. As illustrated in FIG. 7, an erase tail phenomenon may occur at an upper portion of a threshold voltage distribution corresponding to the erase state.

As the program loop progresses, the erase tail phenomenon due to the channel leakage may increase. The erase tail may not occur in early program loops and may increase as the program voltage increases. The flash memory device 1100 according to an embodiment may reduce the erase tail phenomenon through the channel separation operation or the channel connection operation. To this end, the flash memory device 1100 may operate in the channel separation state in early program loops and may then change from the channel separation state to the channel connection state from a specific program loop (or after the early program loops).

FIG. 8 illustrates a table for describing a channel separation operation or a channel connection operation of a flash memory device. As the program loop progresses, the flash memory device 1100 may perform a first channel separation scheme and a second channel separation scheme.

The first channel separation scheme may refer to a scheme in which the channel separation state is maintained regardless of the program loop. The second channel separation scheme may refer to a scheme in which the channel separation state is maintained until a specific program loop (e.g., the k-th program loop) and is then changed into the channel connection state, as described with reference to FIG. 6.

In the first channel separation scheme, the second stack ST2 may be affected when the channel separation at the stack junction is not perfectly made. Threshold voltages of memory cells in the second stack ST2, which are in the erase state, may be disturbed due to the leakage current. The flash memory device 1100 according to an embodiment may perform the channel connection operation or the channel connection operation based on a program loop, thus reducing the leakage current between separated channels and also effectively reducing the disturbance during the program operation.

Figure 9:
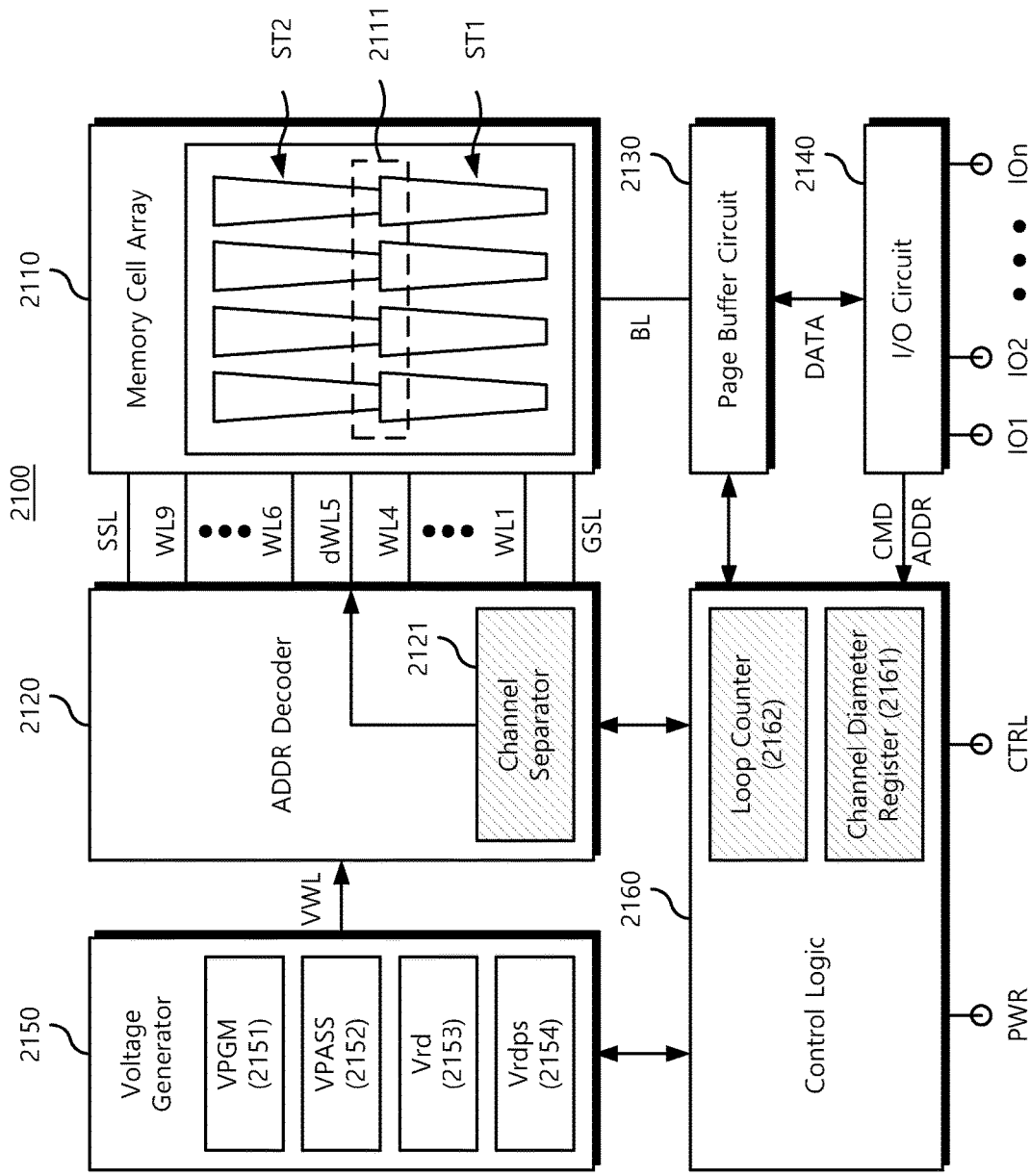
FIG. 9 is a block diagram illustrating a flash memory device according to an embodiment.

FIG. 9 is a block diagram illustrating a flash memory device according to an embodiment. A flash memory device 2100 may be connected with the memory controller 1200 (refer to FIG. 1) through the data input/output line IO, the control line CTRL, and the power line PWR. Referring to FIG. 9, the flash memory device 2100 may include a memory cell array 2110, an address decoder 2120, a page buffer circuit 2130, a data input/output circuit 2140, a voltage generator 2150, and control logic 2160.

The memory cell array 2110 may be formed in a cylindrical pillar structure in which memory cells are stacked in the direction perpendicular to the substrate. A gate electrode layer and an insulation layer may be alternately and repeatedly deposited on the substrate. An information storage layer may be formed between the gate electrode layer and the insulation layer. The information storage layer may include a tunnel insulation layer, a charge trap layer, and a blocking insulation layer.

The gate electrode layers of the memory cell array 2110 may be connected with the ground selection line GSL, the plurality of word lines WL1 to WL4 and WL6 to WL9, the dummy word line dWL5, and the string selection line SSL.

The dummy word line dWL5 may be a word line provided at a junction 2111 of a memory block having a multi-stack structure. The dummy word line dWL5 may connect or separate the channels of the first and second stacks ST1 and ST2 adjacent to each other in the direction perpendicular to the substrate (or may form a channel between the first and second stacks ST1 and ST2 or may separate the first and second stacks ST1 and ST2).

The address decoder 2120 may include a channel separator 2121. The channel separator 2121 may form or block a channel current path between the first and second stacks ST1 and ST2 by controlling one or more dummy word lines dWL5 provided at the junction 2111 of the first and second stacks ST1 and ST2.

The channel separator 2121 may connect or separate the channels of the first and second stacks ST1 and ST2 depending on the program loop count or a word line height. Alternatively, the channel separator 2121 may adjust the channel initial precharge or channel separation timing in the program operation such that the threshold voltage distributions are improved and may perform an operation of reducing hot carrier injection (HCI).

The page buffer circuit 2130 may be connected with the memory cell array 2110 through the bit lines BL. The data input/output circuit 2140 may be internally connected with the page buffer circuit 2130 through data lines and may be externally connected with the memory controller 1200 (refer to FIG. 1) through input/output lines IO1 to IOn. The voltage generator 2150 may be supplied with an internal power from the control logic 2160 and may generate the word line voltage VWL used to read or write data. The voltage generator 2150 may include a program voltage generator 2151, a pass voltage generator 2152, a read voltage generator 2153, and a read pass voltage generator 2154.

The control logic 2160 may control the program, read, and erase operations of the flash memory device 2100 by using the command CMD, the address ADDR, and the control signal CTRL provided from the memory controller 1200. The control logic 2160 may include a channel diameter register 2161 and a loop counter 2162.

The channel diameter register 2161 may receive channel diameter information of each word line from the memory controller 1200, and may generate and store a channel diameter (CD) parameter. The channel diameter register 2161 may control the channel separation operation of the channel separator 2121 by using the channel diameter parameter. During the program operation, the loop counter 2162 may count the number of program loops and may provide the loop count signal to the channel separator 2121.

Figure 10:
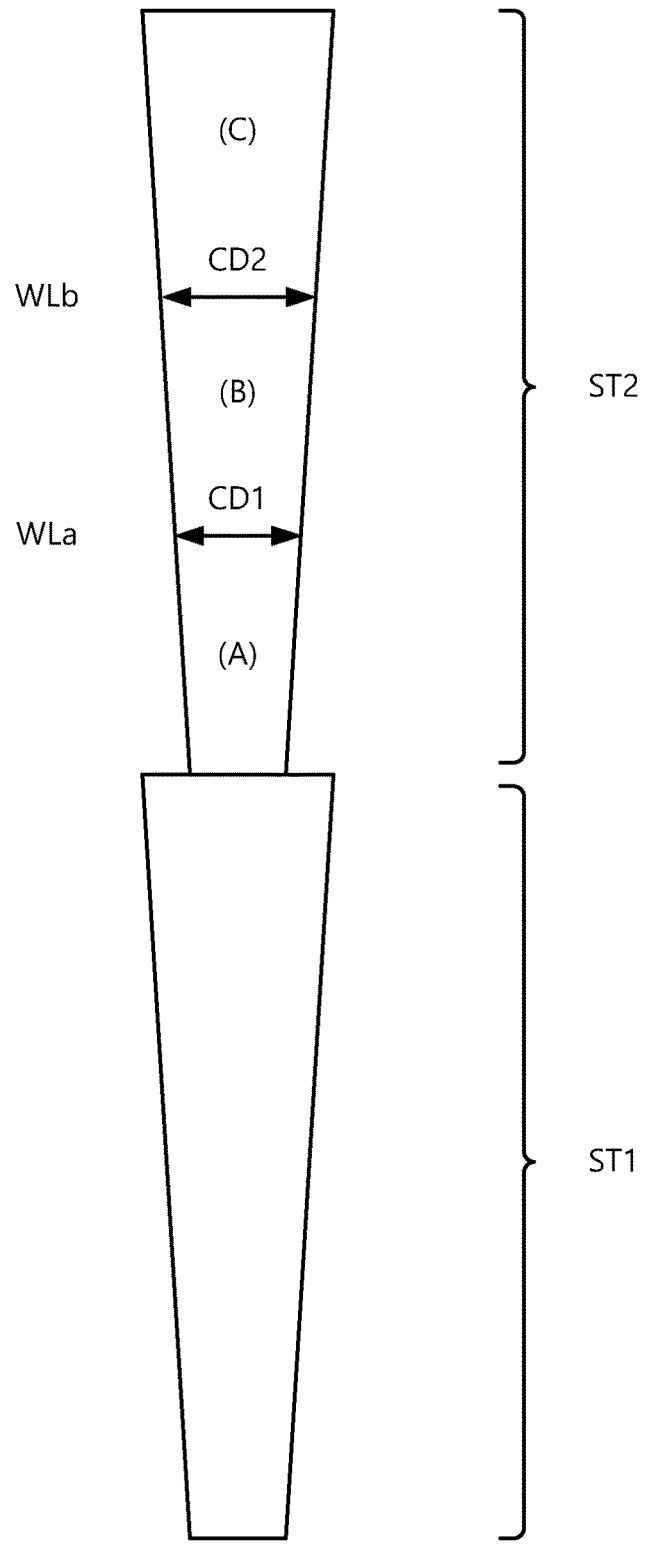
FIG. 10 is a cross-sectional view section conceptually illustrating a vertical cross-section of first and second stacks according to an embodiment.

FIG. 10 is a cross-sectional view section conceptually illustrating a vertical cross-section of first and second stacks illustrated in FIG. 9. Referring to FIG. 10, a pillar of the memory cell array 2110 may be implemented by connecting (or joining) the first stack ST1 and the second stack ST2. The first stack ST1 may be provided under the second stack ST2, and the second stack ST2 may be provided on the first stack ST1. The second stack ST2 provided on the first stack ST1 may be divided into three regions "A", "B", and "C" depending on the channel diameter CD.

Region "A" may refer to a region whose channel diameter CD is smaller than a first channel diameter CD1. Region "B" may refer to a region whose channel diameter CD is greater than the first channel diameter CD1 and is smaller than a second channel diameter CD2. Region "C" may refer to a region whose channel diameter CD is greater than the second channel diameter CD2. The second stack ST2 may also be divided into regions depending on a word line height.

Region "A" refers to a region whose height is lower than that of the a-th word line WLa. Region "B" refers to a region whose height is higher than that of the a-th word line WLa and is lower than that of the b-th word line WLb. Region "C" refers to a region whose height is higher than that of the b-th word line WLb.

Figure 11:
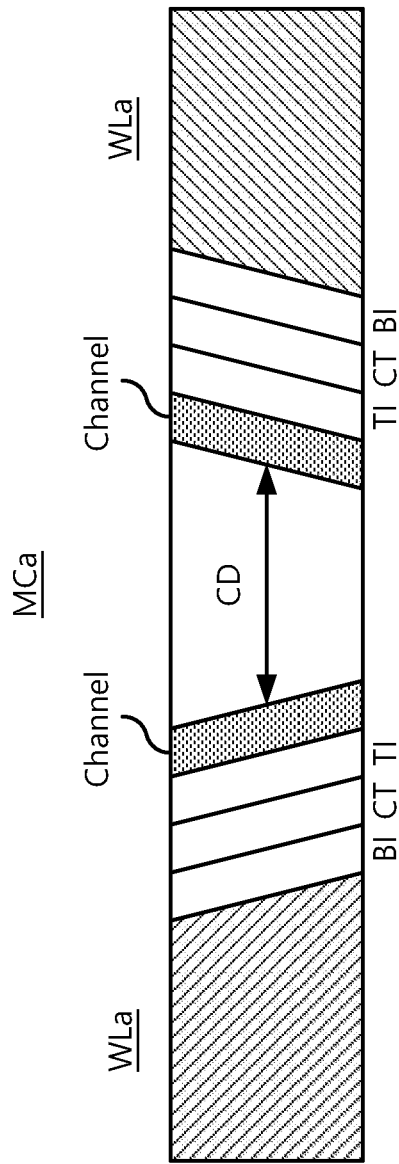
FIG. 11 is a cross-sectional view illustrating a cross-section of a memory cell connected with an a-th word line according to an embodiment.

FIG. 11 is a cross-sectional view illustrating a cross-section of the memory cell MCa connected with the a-th word line WLa illustrated in FIG. 11. The a-th memory cell MCa is illustrated in FIG. 11 as an example. A structure of the b-th memory cell MCb connected with the b-th word line WLb may also be similar to that of the a-th memory cell MCa except for the size.

Referring to FIG. 11, the a-th memory cell MCa may have a cylindrical structure where the channel diameter CD decreases as it goes toward the bottom. An air gap may be present in the a-th memory cell MCa. A channel may be formed of P-type silicon and may form a current path.

The a-th memory cell MCa may include a cylindrical data storage layer surrounding the channel. The data storage layer may include a tunnel insulation layer TI, a charge trap layer CT, and a blocking insulation layer BI. The a-th word line WLa may be formed of a gate electrode layer surrounding the data storage layer. A structure of the string selection transistor SST and the ground selection transistor GST may be similar to that of the a-th memory cell MCa.

Figure 12:
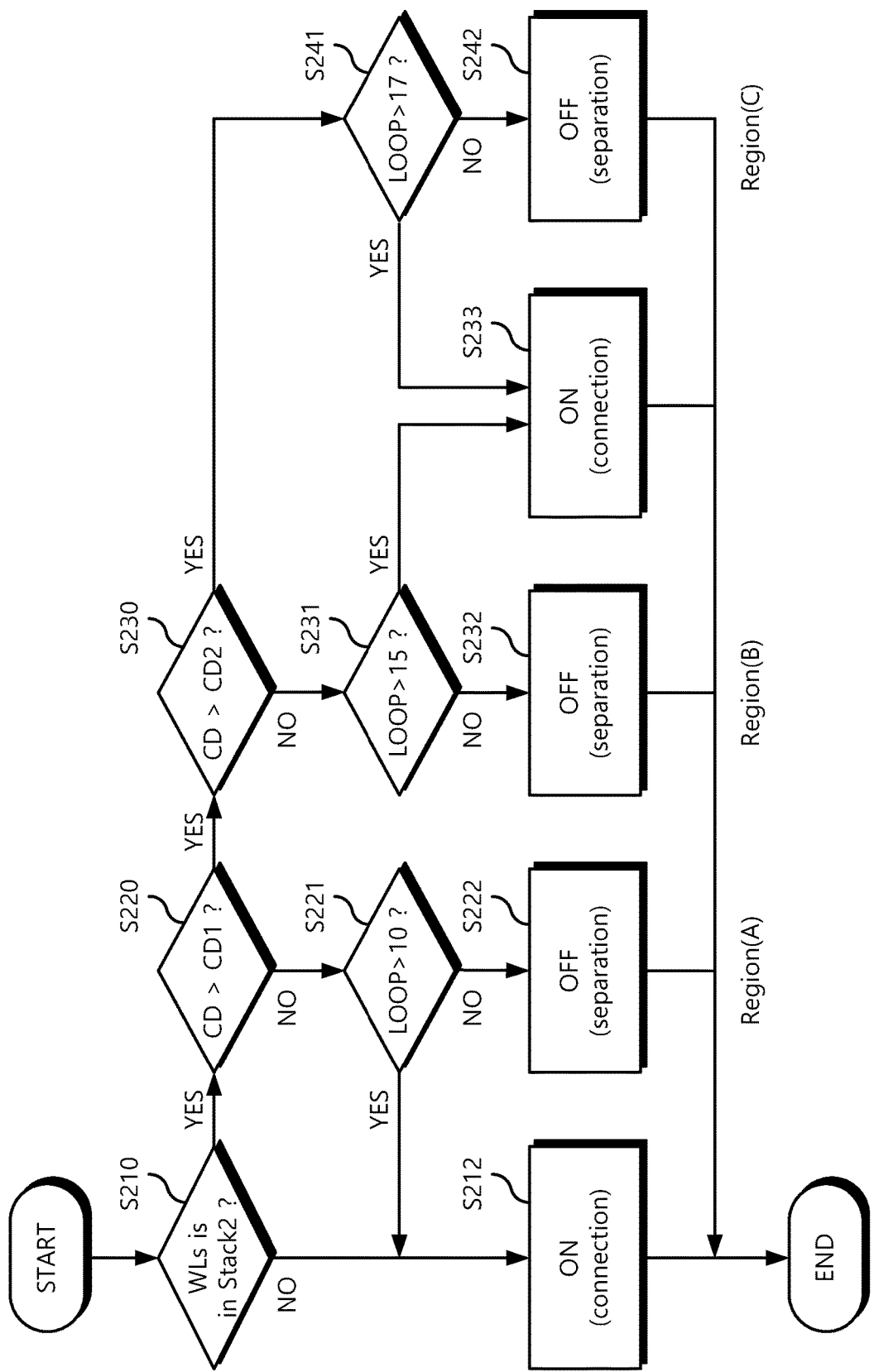
FIG. 12 is a flowchart for describing an operation of a channel separator according to an embodiment.

FIG. 12 is a flowchart for describing an operation of a channel separator according to an embodiment. The channel separation operation or the channel connection operation of the channel separator 2121 illustrated in FIG. 9 will be described in detail with reference to FIGS. 11 and 12. It is assumed that the first stack ST1 and the second stack ST2 are initially in the separation state.

In operation S210, the channel separator 2121 determines whether the selected word line WLs belongs to the second stack ST2. When it is determined that the selected word line WLs is absent from the second stack ST2 and is present in the first stack ST1 (No), the channel separator 2121 may maintain a state where the channels of the first and second stacks ST1 and ST2 are connected.

In operation S220, the channel separator 2121 determines whether the channel diameter CD is greater than the first channel diameter CD1. The case (NO) where the channel diameter CD is smaller than the first channel diameter CD1 corresponds to the case where the selected word line WLs is provided in region "A" in FIG. 10. In this case, the channel separator 2121 determines whether a program loop count value indicating the number of program loops is greater than a first threshold number, such as "10" (S221). When it is determined that the program loop count value is smaller than or equal to "10" (NO), the channel separator 2121 maintains the state where the channels of the first stack ST1 and the second stack ST2 are separated from each other (S222). In contrast, when it is determined that the program loop count value is greater than "10" (YES), the channel separator 2121 changes the channel state from the channel separation state to the channel connection state (S212).

In operation S230, the channel separator 2121 determines whether the channel diameter CD is greater than the second channel diameter CD2. The case (NO) where the channel diameter CD is smaller than the second channel diameter CD2 corresponds to the case where the selected word line WLs is provided in region "B" in FIG. 10. In this case, the channel separator 2121 determines whether the program loop count value is greater than a second threshold number, such as "15" (S231). When it is determined that the program loop count value is smaller than or equal to "15" (NO), the channel separator 2121 maintains the channel separation state (S232). When it is determined that the program loop count value is greater than "15" (YES), the channel separator 2121 changes the channel state from the channel separation state to the channel connection state (S233).

In operation S230, the case (YES) where the channel diameter CD is greater than the second channel diameter CD2 corresponds to the case where the selected word line WLs is provided in region "C" in FIG. 10. In this case, the channel separator 2121 determines whether the program loop count value is greater than a third threshold number, such as "17" (S241). When it is determined that the program loop count value is smaller than or equal to "17" (NO), the channel separator 2121 maintains the channel separation state (S242). In contrast, when it is determined that program loop count value is greater than "17" (YES), the channel separator 2121 changes the channel state from the channel separation state to the channel connection state (S233). The flash memory device 2100 may adjust the number of program loops, at which the channel state changes from the channel separation state to the channel connection state, depending on the channel diameter CD.

The flash memory device 2100 illustrated in FIG. 9 may include dummy word lines in the first and second stacks ST1 and ST2. The flash memory device 2100 may reduce the junction coupling by independently controlling the dummy word lines dWL of the first and second stacks ST1 and ST2, which are present at the junction 2111 of the first and second stacks ST1 and ST2.

Figure 13:
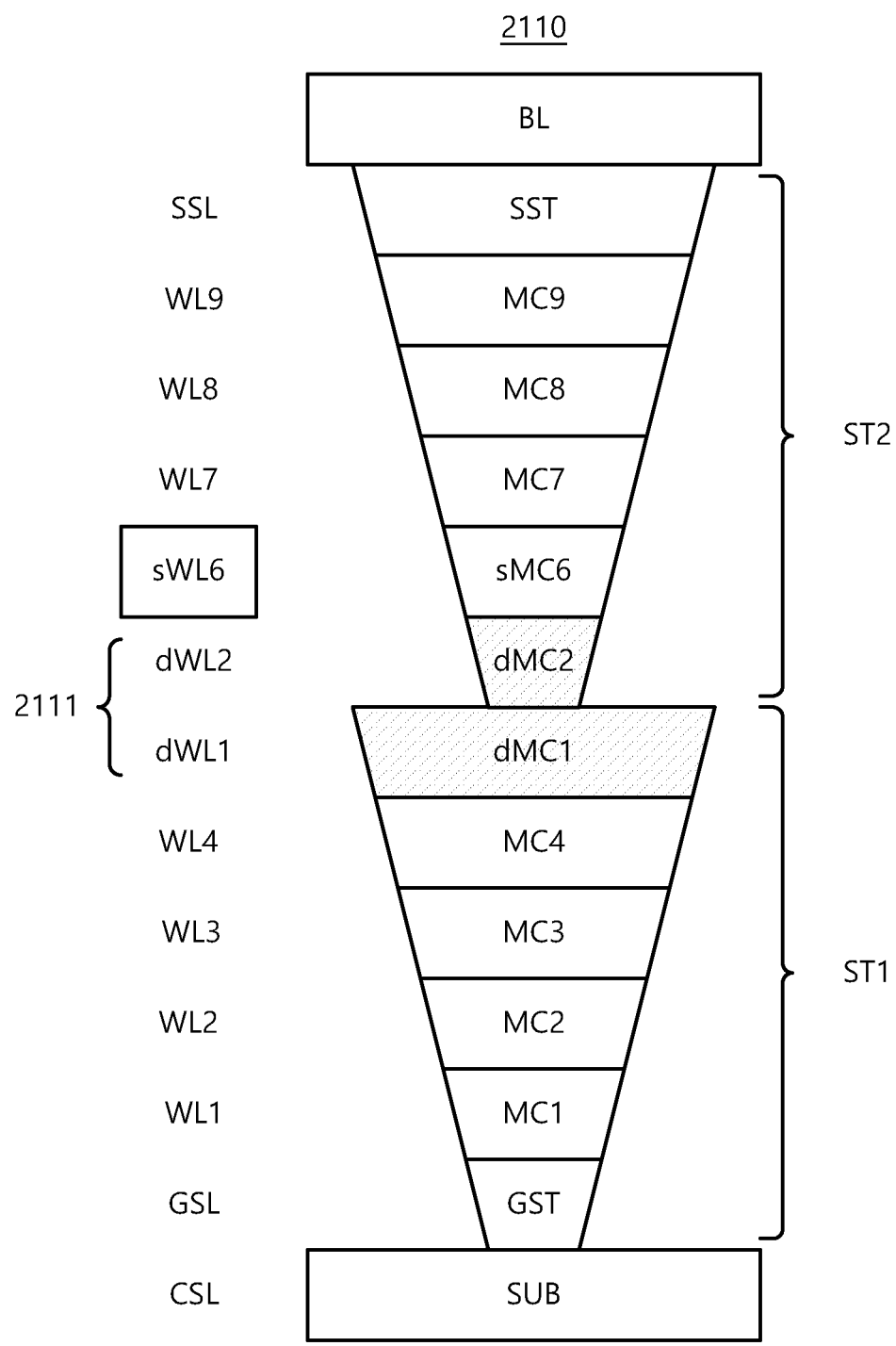
FIG. 13 is a cross-sectional view illustrating an example where dummy word lines are included in first and second stacks of a flash memory device according to an embodiment.

FIG. 13 is a cross-sectional view illustrating an example where dummy word lines are included in both first and second stacks of a flash memory device illustrated in FIG. 9. Referring to FIG. 13, the memory cell array 2110 includes a first dummy word line dWL1 and a second dummy word line dWL2 at the stack junction 2111. The first dummy word line dWL1 may be provided in the first stack ST1, and the second dummy word line dWL2 may be provided in the second stack ST2.

The first and second dummy word lines dWL1 and dWL2 may be controlled independently of each other. The channels of the first and second stacks ST1 and ST2 may be connected or disconnected (or separated) by the first and second dummy word lines dWL1 and dWL2. In addition to the first and second dummy word lines dWL1 and dWL2, other dummy word lines may be present in the first and second stacks ST1 and ST2.

The ground selection line GSL and the first to fourth word lines WL1 to WL4 may be interposed between the common source line CSL and the first dummy word line dWL1. The ground selection transistor GST may be connected with the ground selection line GSL. The first to fourth memory cells MC1 to MC4 may be respectively connected with the first to fourth word lines WL1 to WL4. The first dummy memory cell dMC1 may be connected with the first dummy word line dWL1.

The sixth to ninth word lines WL6 to WL9 may be interposed between the second dummy word line dWL2 and the string selection line SSL. The second dummy memory cell dMC2 may be connected with the second dummy word line dWL2. The sixth to ninth memory cells MC6 to MC9 may be respectively connected with the sixth to ninth word lines WL6 to WL9. The string selection transistor SST may be connected with the string selection line SSL. Herein, the sixth word line WL6 may be a selected word line, and the sixth memory cell MC6 may be a selected memory cell.

The flash memory device 2100 may reduce the junction coupling by independently controlling the first and second dummy word lines dWL1 and dWL2 present at the junction 2111 of the first and second stacks ST1 and ST2. For example, in a program loop where the channel state is the channel separation state, the flash memory device 2100 may apply the separation voltage VMOFF to the first dummy word line dWL1 and may apply the connection voltage VMON to the second dummy word line dWL2. The flash memory device 2100 may apply the separation voltage VMOFF and the connection voltage VMON to the first dummy word line dWL1 and the second dummy word line dWL2 at different timings, respectively.

Figure 14:
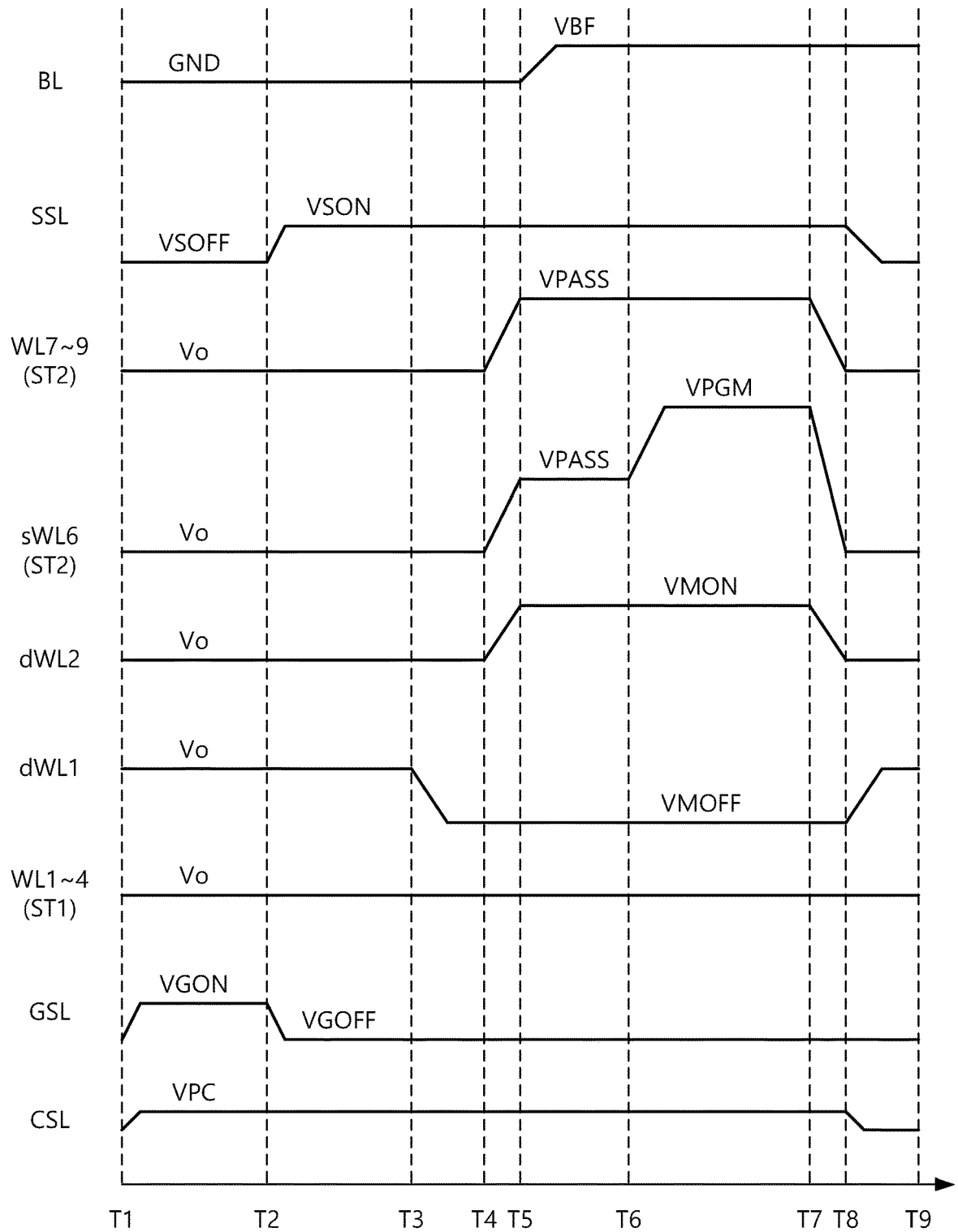
FIG. 14 is a timing diagram illustrating a channel separation operation of a flash memory device according to an embodiment.

FIG. 14 is a timing diagram illustrating a channel separation operation of a flash memory device, such as that illustrated in FIG. 9, according to an embodiment. The flash memory device 2100 may be in the channel separation state in an arbitrary program loop. In the example of FIG. 6, the flash memory device 2100 may be in the channel separation state in the second program loop. During the second program loop, the program voltage VPGM (e.g., a second program voltage VPGM2) may be provided to the selected word line (e.g., sWL6).

Referring to FIG. 14, in a time period from T1 to T2, the channel of the first stack ST1 may be precharged. A turn-off voltage VSOFF may be applied to the string selection line SSL, and a turn-on voltage VGON may be applied to the ground selection line GSL. Because the ground selection transistor GST is in a turned-on state, a precharge voltage VPC of the common source line CSL may be applied to the channels of the first and second stacks ST1 and ST2. The precharge voltage VPC may be applied to the channels of the first and second stacks ST1 and ST2 by using the common source line CSL. In the case where a precharge voltage is provided to the bit line BL in the precharge period, a turn-on voltage VSON may be applied to the string selection line SSL.

In the precharge period, an initial voltage Vo may be applied to the word lines WL1 to WL4 and WL6 to WL9 and the dummy word lines dWL1 and dWL2 of the first and second stacks ST1 and ST2. Herein, the initial voltage Vo means a voltage level capable of turning on erased memory cells. Previously programmed memory cells of the second stack ST2 are turned off. Accordingly, a channel portion between the programmed memory cell and the bit line BL may be floated. In a time period from T2 to T3, a turn-off voltage VGOFF may be applied to the ground selection line GSL, and the turn-on voltage VSON may be applied to the string selection line SSL. At time T3, the channel separator 2121 may provide the separation voltage VMOFF to the first dummy word line dWL1.

At time T4, the pass voltage VPASS may be applied to the sixth to ninth word lines WL6 to WL9 of the second stack ST2. The connection voltage VMON may be provided to the second dummy word line dWL2. Herein, the connection voltage VMON may be the pass voltage VPASS. At the time T6, the program voltage VPGM may be provided to the selected word line sWL6.

Before the program voltage VPGM is provided, at time T5, a bit line force voltage VBF may be provided to the bit line BL. When the channels of the first and second stacks ST1 and ST2 are separated from each other, the channel coupling may decrease. In this case, the effect according to the bit line force voltage VBF may be improved, and thus, the threshold voltage distributions may be improved.

At time T7, a recovery operation may be performed. The program voltage VPGM and the pass voltage VPASS provided to the sixth to ninth word lines WL6 to WL9 of the second stack ST2 may be discharged to a ground voltage.

The connection voltage VMON provided to the second dummy word line dWL2 may be discharged to the ground voltage at time T7. In a time period from T8 to T9, the separation voltage VMOFF provided to the first dummy word line dWL1 of the first stack ST1 may be discharged to the ground voltage.

The flash memory device 2100 may control the point in time T3 when the separation voltage VMOFF is provided to the first dummy word line dWL1 of the first stack ST1, so as to be earlier than the point in time T4 when the connection voltage VMON or the pass voltage VPASS is provided to the second dummy word line dWL2 or the sixth to ninth word lines WL6 to WL9 of the second stack ST2. Also, after the program voltage VPGM is applied, the flash memory device 2100 may control the point in time T8 when the first dummy word line dWL1 is recovered, so as to be later than the point in time T7 when the second dummy word line dWL2 or the sixth to ninth word lines WL6 to WL9 are recovered.

The flash memory device 2100 according to an embodiment may independently control the points in time when the separation voltage VMOFF and the connection voltage VMON are applied to the first dummy word line dWL1 and the second dummy word line dWL2. According to the above description, the program disturbance may be decreased by separating the channels of the first and second stacks ST1 and ST2. Also, the hot carrier injection (HCI) due to a channel potential difference may be prevented by reducing the leakage current due to the channel coupling at the channel junction 2111.

According to the present disclosure, as the channel separation operation is performed depending on a program loop, the leakage current between separated channels may decrease, and the program voltage disturbance and the pass voltage disturbance occurring in the program operation may effectively decrease.

While aspects of embodiments have been particularly shown and described, it will be understood that various changes in form and details may be made therein without departing from the spirit and scope of the following claims.

What is claimed is:

1. A flash memory device comprising:
a first memory cell;
a second memory cell on the first memory cell; and
a third memory cell between the first memory cell and the second memory cell,
wherein the first memory cell, the second memory cell and the third memory cell share a channel,
wherein the third memory cell is configured to block channel sharing between the first memory cell and the second memory cell based on a channel separation voltage provided in first to k-th program loops, and
wherein the third memory cell is configured to connect the channel sharing between the first memory cell and the second memory cell based on a channel connection voltage provided to the third memory cell in a (k+1)-th program loop.

2. The flash memory device of claim 1, wherein the first memory cell and the second memory cell are provided in a common stack.

3. The flash memory device of claim 2, wherein the first memory cell is programmed after the second memory cell is programmed.

4. The flash memory device of claim 2, wherein the second memory cell is programmed after the first memory cell is programmed.

5. The flash memory device of claim 1, wherein the first memory cell and the second memory cell are provided in different stacks.

6. The flash memory device of claim 5, wherein the third memory cell and the first memory cell are provided in a common stack.

7. The flash memory device of claim 6, further comprising:
a fourth memory cell sharing the channel, wherein a program voltage is provided to the fourth memory cell during a program operation; and
a fifth memory cell sharing the channel, wherein a pass voltage is provided to the fifth memory cell during the program operation,
wherein, in the first to k-th program loops, the channel separation voltage is provided to the third memory cell before the pass voltage is provided to the fifth memory cell.

8. The flash memory device of claim 7, wherein the channel separation voltage provided to the third memory cell is recovered after the pass voltage provided to the fifth memory cell is recovered.

9. The flash memory device of claim 6, further comprising:
a fourth memory cell sharing the channel, wherein a program voltage is provided to the fourth memory cell during a program operation; and
a fifth memory cell sharing the channel,
wherein the program voltage is provided to the fifth memory cell after the fourth memory cell is programmed, and
wherein the fifth memory cell is closer to a substrate of the flash memory device than the fourth memory cell.

10. The flash memory device of claim 6, further comprising:
a fourth memory cell sharing the channel, wherein a program voltage is provided to the fourth memory cell during a program operation; and
a fifth memory cell sharing the channel,
wherein the program voltage is provided to the fifth memory cell after the fourth memory cell is programmed, and
wherein the fifth memory cell is farther from a substrate of the flash memory device than the fourth memory cell.

11. A flash memory device comprising:
a first word line connected with a first memory cell;
a second word line connected with a second memory cell on the first memory cell; and
a third word line connected with a third memory cell between the first memory cell and the second memory cell,
wherein the first memory cell, the second memory cell and the third memory cell share a channel, and
wherein regions of the channel are classified depending on a location of the second word line, and a channel separation voltage or a channel connection voltage is provided to the third word line depending on a number of program loops, which is differently determined depending on the regions.

12. The flash memory device of claim 11, wherein the first memory cell and the second memory cell are provided in different stacks.

13. The flash memory device of claim 12, further comprising:
a fourth word line connected with a fourth memory cell sharing the channel; and a fifth word line connected with a fifth memory cell sharing the channel, wherein, while a program operation is performed on the fourth word line, a first point in time when the channel separation voltage is provided to the third memory cell is earlier than a second point in time when a pass voltage is provided to the fifth memory cell, and a third point in time when the channel connection voltage is provided to the third memory cell after the channel separation voltage is provided to the third memory cell is later than a fourth point in time when the pass voltage is recovered after the pass voltage is provided to the fifth memory cell.

14. The flash memory device of claim 12, further comprising:
a fourth word line connected with a fourth memory cell sharing the channel, wherein a program voltage is provided to the fourth memory cell during a program operation; and
a fifth word line connected with a fifth memory cell sharing the channel,
wherein the program voltage is provided to the fifth memory cell after the fourth memory cell is programmed, and
wherein the fifth word line is closer to a substrate of the flash memory device than the fourth word line.

15. The flash memory device of claim 12, further comprising:
a fourth word line connected with a fourth memory cell sharing the channel, wherein a program voltage is provided to the fourth memory cell during a program operation; and
a fifth word line connected with a fifth memory cell sharing the channel,
wherein the program voltage is provided to the fifth memory cell after the fourth memory cell is programmed, and
wherein the fifth word line is farther from a substrate of the flash memory device than the fourth word line.

16. A channel separation method of a flash memory device which includes a first stack including first memory cells, and a second stack including second memory cells provided on the first stack, the channel separation method comprising:
defining a plurality of regions depending on channel diameters of the second memory cells;
determining whether a program loop associated with a memory cell selected from the second memory cells reaches a specific program loop; and
controlling channel connection or channel separation between the first stack and the second stack depending on a number of program loops,
wherein the controlling the channel connection or the channel separation is differently determined for each of the plurality of regions.

17. The channel separation method of claim 16, wherein programming progresses from the second stack to the first stack.

18. The channel separation method of claim 16, wherein programming progresses toward a substrate of the flash memory device or away from the substrate, based on a selected memory cell among the second memory cells.

19. The channel separation method of claim 16, wherein the channel separation between the first stack and the second stack is made by providing a separation voltage to at least one memory cell provided at a junction of the first stack and the second stack.

20. The channel separation method of claim 19, further comprising providing a precharge voltage to a common source line before providing the separation voltage.

* * * * *